(12) United States Patent  
Huang et al.

(10) Patent No.: US 9,031,808 B2  
(45) Date of Patent: May 12, 2015

(54) SYSTEM OF TESTING MULTIPLE RF MODULES AND METHOD THEREOF

(75) Inventors: Shih-Feng Huang, Hsinchu (TW); Yueh-Cheng Lee, New Taipei (TW); Chung-Er Huang, New Taipei (TW)

(73) Assignee: Azurewave Tehnologies, Inc., New Taipei (TW)

( * ) Notice: Subject to any disclaimer, the term of this patent is extended or adjusted under 35 U.S.C. 154(b) by 566 days.

(21) Appl. No.: 13/423,215

(22) Filed: Mar. 17, 2012

(65) Prior Publication Data  
US 2013/0158933 A1  Jun. 20, 2013

(30) Foreign Application Priority Data  
Dec. 19, 2011 (TW) .............................. 100147045 A

(51) Int. Cl.  
*G01R 31/28* (2006.01)

(52) U.S. Cl.  
CPC ............ *G01R 31/2822* (2013.01); *H04B 17/20* (2015.01); *H04B 17/29* (2015.01)

(58) Field of Classification Search  
CPC .................................................. G01R 31/2822  
USPC ........................................................ 702/122  
See application file for complete search history.

(56) References Cited

U.S. PATENT DOCUMENTS

| 6,785,540 B1* | 8/2004 | Wichelman .................... 455/423 |
| 7,437,261 B2* | 10/2008 | Pramanick et al. ........... 702/117 |
| 2005/0240852 A1* | 10/2005 | Inaba et al. .................... 714/740 |
| 2011/0090799 A1 | 4/2011 | El-Hassan et al. | |

FOREIGN PATENT DOCUMENTS

| TW | I227079 B | 1/2005 |
| TW | 201135258 A | 10/2011 |

* cited by examiner

*Primary Examiner* — Bryan Bui  
(74) *Attorney, Agent, or Firm* — Li & Cai Intellectual Property (USA) Office

(57) ABSTRACT

This invention provides a system of testing multiple RF modules. The system includes a RF signal analyzer, a RF switch, a control module, and a plurality of testing modules. The RF switch is electrically coupled to the RF signal analyzer, and operational bands of the RF switch includes operational bands of the RF modules for transmitting and receiving RF signals. The controller module controls the RF signal analyzer and the RF switch. The testing modules are electrically coupled to the controller module and controlled by the controller module. Each testing module has a memorizing unit for storing testing results for the RF modules transmitting and receiving the RF signals. The RF switch and the testing modules are used to electrically couple each RF module.

8 Claims, 4 Drawing Sheets

SYSTEM OF TESTING MULTIPLE RF MODULES AND METHOD THEREOF

BACKGROUND OF THE INVENTION

1. Field of the Invention

The instant disclosure relates to a RF (Radio Frequency) testing system; in particular, to a system of testing multiple RF modules and method thereof 2. Description of Related Art Electronic devices installed with RF (Radio Frequency) modules can transmit or receive data (or signals) by using currently existing wireless communication infrastructure and radio frequency bands. The transmission rate (or data rate) of the wireless communication has been approaching to be on part with the data rate of the traditional Ethernet, thus the electronic devices that are wireless communication-enabled have been gaining their popularity. At the present, the RF modules in the electronic devices that are wireless communication-enabled are the most expensive/critical part of the electronic devices, and thus the performance quality of the RF modules is always the focus of manufacturers for the RF modules. Therefore, before the RF modules are placed into the stream of the commerce, the manufacturers tend to test the performance quality of the RF modules for ensuring the RF modules are at the satisfactory level.

When any RF module is tested, a RF analyzer (or so-called spectrum analyzer) is used for testing the receipt and the transmission of RF signals. However, the limited access to the RF analyzer and the limited number of input/output ports of the RF analyzer likely cap the number of the RF modules to be tested by the RF analyzer at the same time.

SUMMARY OF THE INVENTION

The object of the instant disclosure is to provide a system of testing multiple RF modules and method thereof.

In order to achieve the aforementioned objects, according to an embodiment of the instant disclosure, a system of testing multiple RF modules is offered. The system is for testing the multiple RF modules in an operation mode. The testing system includes a RF analyzer, a RF switch, a controller module, and a plurality of testing modules. The RF switch is electrically coupled to the RF analyzer. Operational band of the RF switch encompass operational bands of the RF modules for transmitting and receiving RF signals. The controller module is electrically coupled to the RF analyzer and the RF switch. The controller module controls the RF analyzer and the RF switch. These testing modules are electrically coupled to the controller module and are controlled by the controller module. Each of the testing modules has a memorizing unit for storing the testing results. The RF switch and these testing modules are utilized to connect each of the RF modules.

The disclosed method, meanwhile, includes causing the testing modules to configure the RF modules to operate in the same operation mode by the controller module, and determining whether to conduct a test of transmitting the RF signals or a test of receiving the RF signals for the RF modules.

In order to further the understanding regarding the instant disclosure, the following embodiments are provided along with illustrations to facilitate the disclosure of the instant disclosure.

DETAILED DESCRIPTION OF THE EXAMPLE EMBODIMENTS

The aforementioned illustrations and following detailed descriptions are exemplary for the purpose of further explaining the scope of the instant disclosure. Other objectives and advantages related to the instant disclosure will be illustrated in the subsequent descriptions and appended drawings.

[An Embodiment of a System for Testing Multiple RF Modules]

Figure 1:
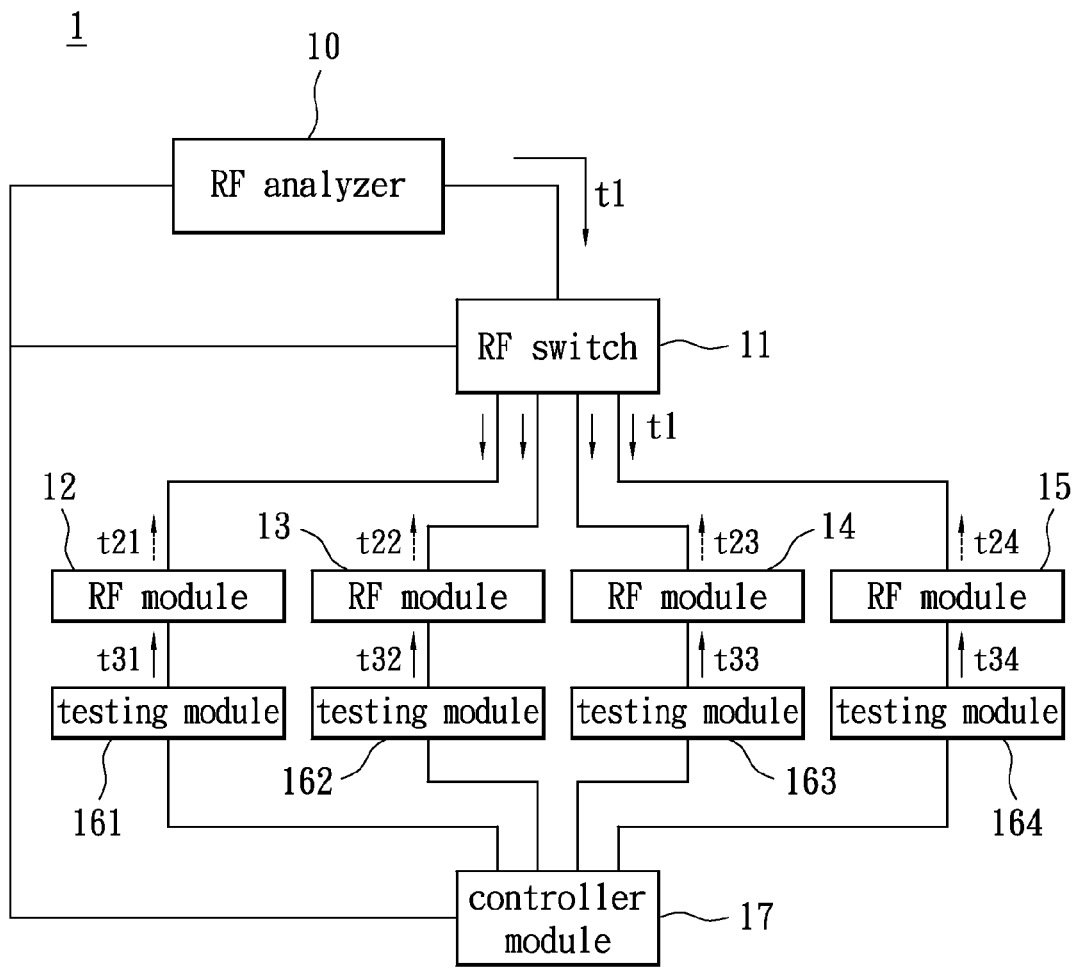
FIG. 1 shows a block diagram of a system for testing multiple RF modules according to an embodiment of the instant disclosure.

Please refer to FIG. 1 showing a block diagram of a system for testing multiple RF modules 1 according to an embodiment of the instant disclosure. The system of testing multiple RF modules 1 (hereinafter referred to as testing system) is utilized for testing multiple RF modules when operating in an operation mode. The operation mode comprises causing the RF module to receive RF signals (Rx), transmit the RF signals (Tx), and to select operational frequency band. In this embodiment, the number of RF modules is four, but the invention is not restricted thereto. As shown in FIG. 1, the testing system 1 comprises a RF analyzer 10, a RF switch 11, a controller module 17, and testing modules 161~164.

The RF switch 11 is electrically coupled to the RF analyzer 10. The controller 17 is electrically coupled to the RF analyzer 10 and the RF switch 11. The testing modules 161~164 are electrically coupled to the controller module 17. Each of the RF modules 12~15 is electrically coupled between the RF switch 11 and each of the testing modules 161~164 respectively. In other words, the RF module 12 is electrically coupled between the RF switch 11 and the testing module 161. The RF module 13 is electrically coupled between the RF switch 11 and the testing module 162. The RF module 14 is electrically coupled between the RF switch 11 and the testing module 163, and the RF module 15 is electrically coupled between the RF switch 11 and the testing modules 164. In this embodiment, each of the testing modules 161~164 are electrically coupled to its corresponding RF module, with the testing modules 161~164 and the RF modules 12~15 being the same in number.

The controller module 17 controls the RF analyzer 10, the RF switch 11, and the testing modules 161~164. The controller module 17 may control the RF analyzer 10 and the RF switch 11 through General Purpose Interface Bus (GPIB), but the invention is not restricted thereto. The controller module 17 may control the testing modules 161~164 through Serial Bus, such as Recommended Standard 232 (RS-232). When the controller module 17 and the testing modules 161~164 are computers in one implementation, the controller module 17 and the testing modules 161~164 may be connected with Ethernet, but the invention is not restricted thereto.

Please refer to FIG. 1 again. The RF analyzer 10 is controlled by the controller module 17 and is used for generating the RF signals or receiving the RF signals. As shown in FIG. 1, the RF analyzer 10 may receive the RF signals from the RF switch 11. The RF analyzer 10 may also generate a RF signal t1 and transmit the RF signal t1 to the RF switch 11. At the time when the RF modules 12~15 go through the test of receiving the RF signal, the RF signal t1 generated by the RF analyzer 10 is transmitted to the RF modules 12~15 through the RF switch 11. On the other hand, when the RF modules 12-15 are subject to the test of transmitting the RF signals the RF signals t21~t24 generated by the RF modules 12~15 may be transmitted to the RF analyzer 10 through the RF switch 11. And the RF analyzer 10 may receive the RF signals t21-t24 transmitted from the RF modules 12-15 before generating corresponding testing results according to the received RF signals t21~t24 and transmitting the testing results to the controller module 17.

It is worth mentioning that the testing results may include the power or the intensity of the RF signals t21~t24. The power of the RF signals t21~t24 is the actual power of the RF signals t21~t24 received by the RF analyzer 10. The manner of connecting the RF switch 11 with the RF analyzer 10 and the RF modules 12~15 may be implemented by using low loss coaxial cables. When the RF modules 12-15 is under the test of transmitting the RF signals (Tx), the output power of the RF modules 12~15 may be derived according to the power of the RF signals t21-t24 since the loss of the coaxial cables and the internal loss of the RF switch 11 in terms of dB are known beforehand. Furthermore, when the output power of the RF modules 12~15 are determined, the power efficiency of the RF modules 12-15 can be derived according to the ratio of the output power of the RF modules 12-15 and the actual power consumption of the same RF modules 12~15. It is worth mentioning that the sensitivity of the RF modules 12~15 can be measured by having the RF modules 12-15 to go through the test of receiving the RF signals, which would be further detailed in following paragraphs.

The operational frequency band of the RF switch 11 comprises the frequency bands of receiving the RF signals and the frequency bands of transmitting the RF signals for the RF modules 12~15. For example, the RF modules 12~15 can be a GPS module, a WiFi module, a Bluetooth module, or a Frequency-Modulation (FM) module. Because the operational frequency bands of the RF modules 12~15 may vary depending on the implementation of the RF modules 12-15, the operational frequency band of the RF switch 11 may have encompass all operational bands (including the operational bands for both the receipt of the RF signals and the transmission of the same) of the RF modules 12~15.

For example, the operational band of a GPS-based system is associated with a frequency of 1575.42 KHz as the central frequency thereof, and the bandwidth is at least 2.046 MHz for serving as the L1 channel. The operational band employed by a WiFi-based system may be associated with the central frequencies of 2.45 GHz and 5.8 GHz for Industrial, Scientific and Medical (ISM) bands between 2.4 GHz~2.5 GHz and 5.725 GHz~5.875 GHz. It is worth mentioning that the operational bands of the RF switch 11 are configured according to the RF modules 12~15, and thus the operational bands of the RF switch 11 may correspond to the operational bands of the RF modules 12-15.

Furthermore, since the RF switch 11 is controlled by the controller module 17 the RF switch 11 may transmit the RF signal t1 generated by the RF analyzer 10 to each of the RF modules 12~15 when the RF modules 12-15 are tested for their respective performance of receiving the RF signals. When subjecting the RF modules 12~15 to the test of receiving the RF signals, the controller module 17 controls the testing modules 161~164 to transmit testing signals t31~t34 to RF modules 12~15 respectively, before the RF modules 12~15 could respond with RF signal t21~t24 according to testing signals t31~t34. The RF signals t21~t24 generated by the RF modules 12~15 may be thereafter transmitted to the RF analyzer 10 through the RF switch 11.

It is worth mentioning that, in this embodiment, when being tested for the performance of transmitting the RF signals, each RF module (12~15) generates the RF signal (t21~t24) respectively so that the controller module 17 controls the RF switch 11 to sequentially transmit the received RF signals t21~t24 to the RF analyzer 10 for analyzing. For example, the RF switch 11 may be controlled to firstly transmit the RF signal t21 to the RF analyzer 10, before transmitting the RF signal t22 to the RF analyzer 10. And the RF switch 11 may thereafter transmit the RF signal t23 to the RF analyzer 10 before doing the same for the RF signal t24. In doing so, the RF switch 11 may be controlled to minimize interferences and therefore improve the accuracy of the tests for the RF modules 12-15.

The testing modules 161~164 may be controlled by the controller module 17. Each of the testing modules 161~164 has a memorizing unit (not shown in the figure) for storing the testing results. The memorizing unit may be a hard disk, or a memory. Specifically speaking, when the RF modules 12~15 are tested for the performance of the receipt of the RF signals, the generated testing results by the RF modules 12~15 may be transmitted to and stored in the testing modules 161~164. The testing results of the testing modules 161~164 may include the power of the RF signal t1 or the intensity of the RF signal t1 received by the RF modules 12~15. According to the power of the RF signal t1 received by the RF modules 12~15, the power efficiency of the RF modules 12~15 may be calculated. When it comes to measuring the sensitivity of the receipt of the RF signals of the RF modules 12~15, since the power of the RF signal t1 transmitted from the RF switch 11 through the coaxial cables to the RF modules 12~15 may be measured, the measured power of the RF signal t1 may be compared with the signal intensity of the RF signal t1 in each sub-band (or channel).

It is worth mentioning that the linkage between the testing modules 161~164 and the controller module 17 may be accomplished by using the wired connection, such as using coaxial cables. Despite the above-mentioned linkage may be implemented wirelessly more interferences may have the impact on the accuracy of the testing of the RF modules 12~15.

[Another Embodiment of a System of Testing Multiple RF Modules]

Figure 2:
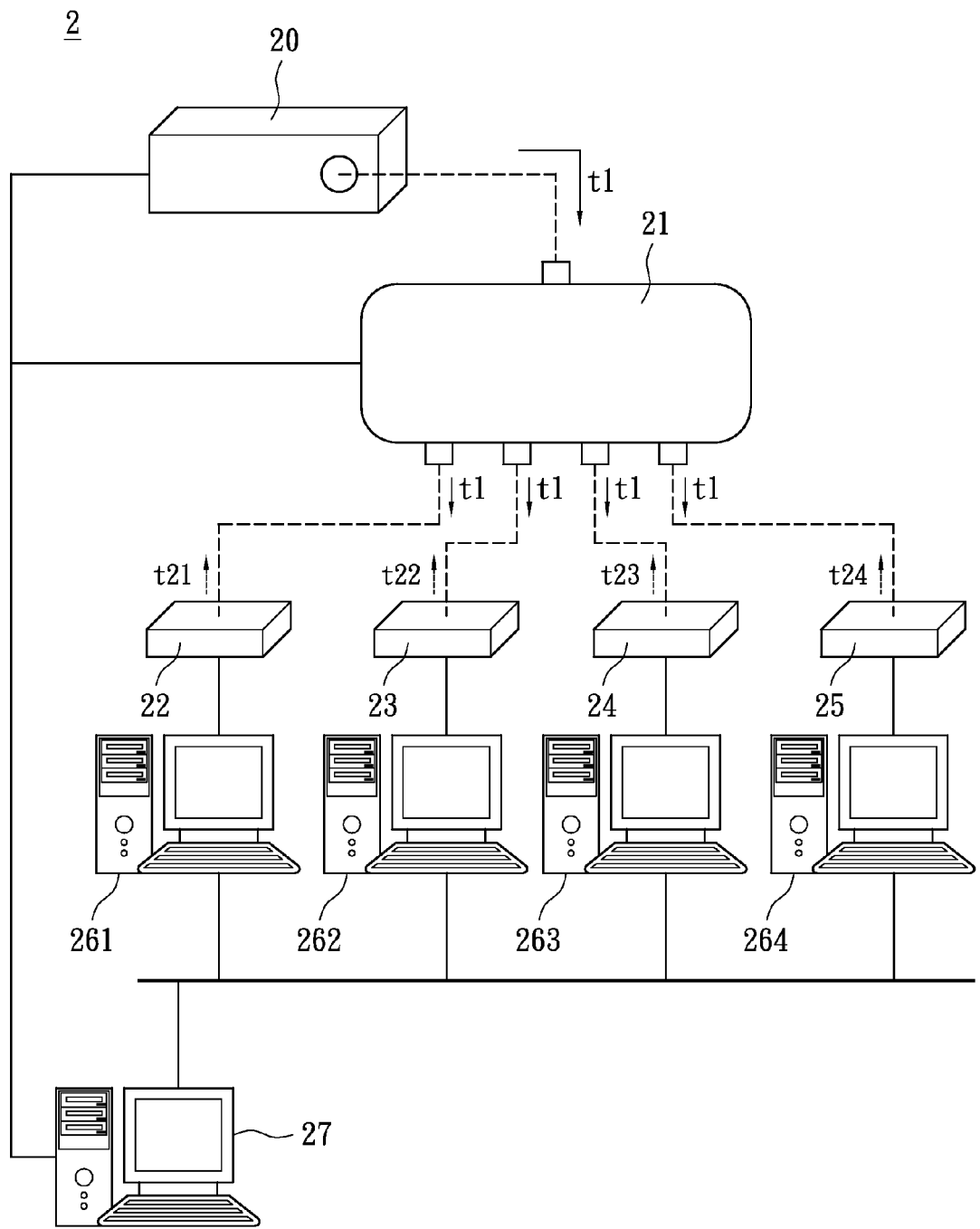
FIG. 2 shows a block diagram of a system for testing multiple RF modules according to another embodiment of the instant disclosure.

Please refer to FIG. 1 and FIG. 2, FIG. 2 shows a block diagram of a system for testing multiple RF modules 2 according to another embodiment of the instant disclosure. The testing system 2 comprises a RF analyzer 20, a RF switch 21, a controller module 27, and testing modules 261~264. The controller module 27 and the testing modules 261~264 are computers in one implementation.

The RF switch 21 is electrically coupled to the RF analyzer 20. The controller module 27 is electrically coupled to the RF analyzer 20 and the RF switch 21. The testing modules 261~264 are electrically coupled to the controller module 27. Each of the RF modules 22~25 is electrically coupled between the RF switch 21 and each of the testing modules 261~264 respectively. In other words, each of the RF modules 22-25 may correspond to each of the testing modules 261-264.

Please refer to FIG. 2. In this embodiment, the controller module 27 connects to the RF analyzer 20 and the RF switch 21 through the GPIB. The controller 27 and the testing modules 261~264 may be connected by Ethernet. For example, the controller 27 and testing modules 261~264 communicate with each other by Transmission Control Protocol/Internet Protocol (TCP/IP). The RF modules 22~25 may interface with the testing modules 261~264 using the interface of products housing the RF modules 22-25. For example, the RF modules 22~25 can be in the form of adaptor cards for connecting with note-books through the interfaces including but not limited to Universal Serial Bus (USB) and Personal Computer Memory Card International Association (PCMCIA). Additionally, the RF modules 22~25 may interface with the testing modules 261~264 by the interface of the RF modules 22~25.

[Another Embodiment of a System of Testing Multiple RF Modules]

Figure 3:
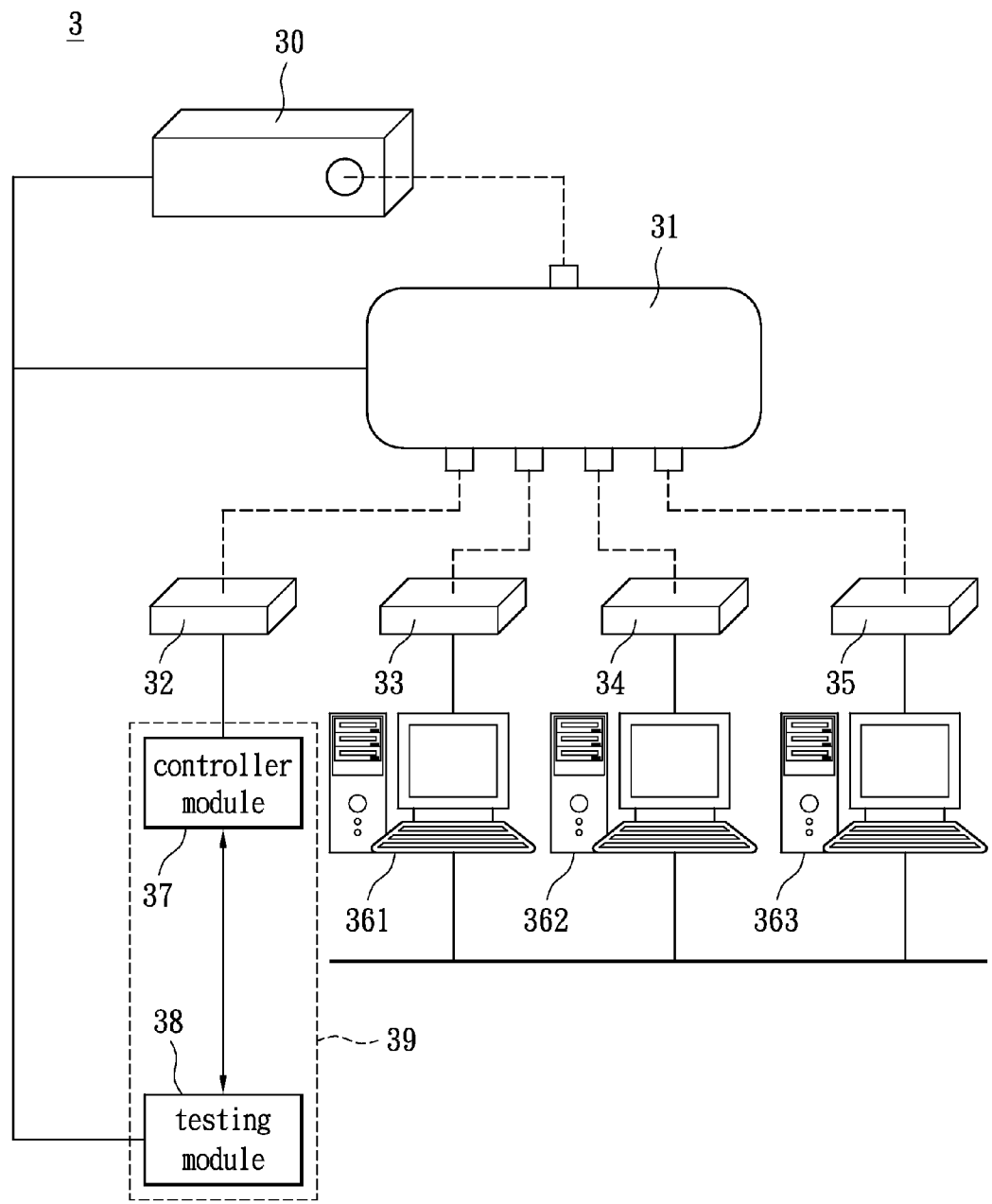
FIG. 3 shows a block diagram of a system of testing multiple RF modules according to another embodiment of the instant disclosure.

Please refer to FIG. 2 and FIG. 3, FIG. 3 shows a block diagram of a system of testing multiple RF modules 3 according to another embodiment of the instant disclosure. The testing system 3 comprises a RF analyzer 30, a RF switch 31, a computer 39 having a controller module 38, and testing modules 37, along with other computers 361, 362, and 363. It is worth mentioning that the computer 39 may be configured to control the testing modules in the computers 361~363, the RF analyzer 30, and the RF switch 31 during the tests. Other components of the testing system 3 can be the same as to the components in testing system 2, thus the redundant information is not repeated.

[An Embodiment of a Method of Testing Multiple RF Modules]

Figure 4:
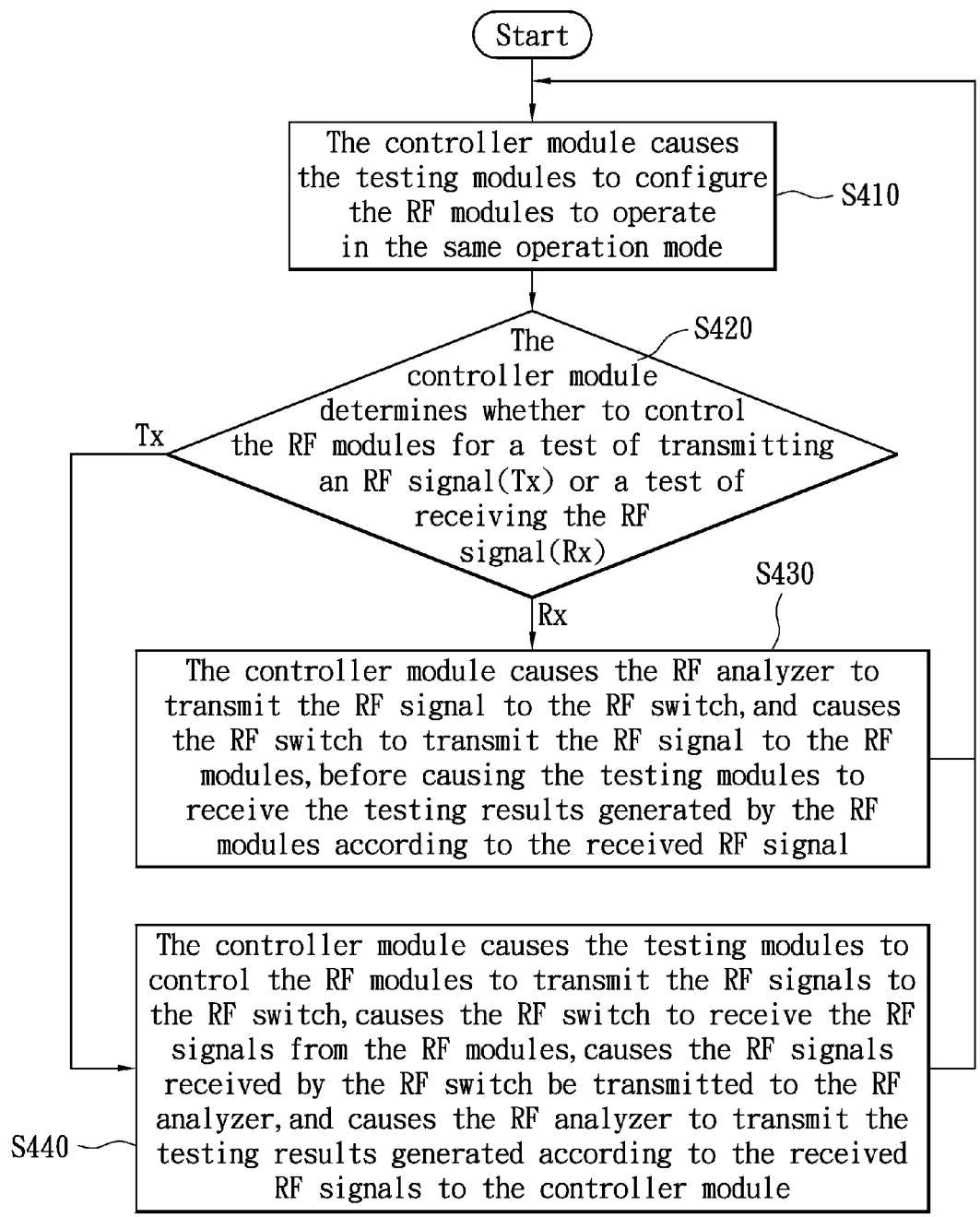
FIG. 4 shows a flow chart of a method of testing multiple RF modules according to an embodiment of the instant disclosure.

Please refer to FIG. 1 and FIG. 4, FIG. 4 shows a flow chart of a method of testing multiple RF modules according to an embodiment of the instant disclosure. The method of testing multiple RF modules such as the RF modules 12-15 (hereinafter referred to as testing method) is incorporated into the testing system 1, with the testing system 1 having the RF analyzer 10, the RF switch 11, the controller module 17, and testing modules 161~164.

The testing method in FIG. 4 may include the following steps. In step S410, the controller module 17 may control the testing modules 161~164 to configure all the RF modules 12~15 to operate in the same operation mode.

In step S420, the controller module 17 determines whether to test the RF modules 12~15 for their performance of receiving or transmitting the RF signals. If the RF modules 12-15 are tested for their receipt of the RF signals, the method may proceed to the step S430. On the other hand, the flow may go to the step S440 at the time when the RF modules 12-15 are tested for their transmission of the RF signals.

In step S430, the controller module 17 may cause the RF analyzer 10 transmit the RF signal t1 to the RF switch 11, which in turn is caused to transmit the RF signal t1 to the RF modules 12~15. The controller module 17 may be configured to cause the testing modules 161~164 to receive the testing results generated by the RF modules 12~15 after the RF modules 12~15 receive the RF signal t1. Thereafter, the flow may return to the step S410. It is worth mentioning that the RF signal t1 may vary depending on the selection of the RF modules 12~15. For example, the RF signals may be Bluetooth signals when the RF modules 12-15 are Bluetooth-based modules.

In step S440, the controller module 17 may cause the testing modules 161~164 to control the RF modules 12~15 to transmit the RF signals t21~t24 to the RF switch 11, cause the RF signals t21~t24 received by the RF switch 11 to be transmitted to the RF analyzer 10, and cause the RF analyzer 10 to transmit the testing results generated according to the received RF signals t21~t24 back to the controller module 17.

It is worth mentioning that the RF signals t21~t24 transmitted by the RF modules 12~15 may be different from each other as the RF modules 12~15 may be different in types. However, in order to increase the efficiency, the RF modules 12~15 may be configured to operate in the same operation mode in the step S410, with the RF signals t21~t24 being the same in type during the step S440. When the flow of the method is at the step S410 again that the RF modules 12~15 may have been configured to operate in another operation mode may dictate the type of the RF signals t21~t24. In other words, the RF signals may be the Bluetooth signal when the step S410 is visited for the first time at which point the RF modules 12-15 operate in one operation mode. And the RF signals t21~t24 may be the WiFi signals when the step S410 is revisited for another time at which point the RF modules 12-15 may operate in another operation mode.

According to these embodiments of the instant disclosure, the system of testing multiple RF modules and method thereof may test multiple RF modules at the same time. Different kinds of RF modules may be tested with only one RF analyzer and one RF switch. During each of the tests, the RF modules may be configured to be operating in the same operation mode. After the test for the RF modules in one operation mode concludes, the operation mode of the RF modules may be changed to another operation mode for another round of test.

The descriptions illustrated supra set forth simply the preferred embodiments of the instant disclosure; however, the characteristics of the instant disclosure are by no means restricted thereto. All changes, alternations, or modifications conveniently considered by those skilled in the art are deemed to be encompassed within the scope of the instant disclosure delineated by the following claims.

What is claimed is:

1. A system of testing multiple RF modules, for testing multiple radio frequency (RF) modules operating in an operation mode, comprising:
    a RF analyzer;
    a RF switch, electrically coupled to the RF analyzer and associated with operational bands comprising operational bands of the RF modules for transmitting a first RF signal from the RF analyzer to the RF modules and transmitting a second RF signal from the RF modules to the RF analyzer;
    a controller module, electrically coupled to the RF analyzer and the RF switch, for controlling the RF analyzer and the RF switch; and
    a plurality of testing modules, electrically coupled the controller module and controlled by the controller module, for transmitting testing signals to the RF modules and receiving first testing results of the RF modules, each of the testing modules having a memorizing unit for storing first testing results of the RF modules after the RF modules receive the first RF signals when operating in the operation mode;
    wherein each of the RF modules is electrically coupled between the RF switch and each of the testing modules respectively;
    wherein when the controller module conducts a test for receiving the first RF signal for the RF modules, the testing modules transmit first testing results generated by the RF modules according to the received first RF signal to the controller module;
    wherein when the controller module conducts a test for transmitting the second RF signal for the RF modules, the RF analyzer transmits second testing results to the controller module according to the received second RF signal;

wherein the first testing results include a power or an intensity of the RF signals, a power efficiency and a sensitivity of the RF modules.

2. The system of testing multiple RF modules according to claim 1, wherein when operating in the operation mode the RF modules receives the RF signals, transmits the RF signals, or selects the operational band.

3. The system of testing multiple RF modules according to claim 1, wherein the RF modules are WiFi modules, Bluetooth modules, Global Positioning System (GPS) modules, or Frequency-Modulation (FM) modules.

4. The system of testing multiple RF modules according to claim 1, wherein the controller module and the plurality of testing modules are connected through an Ethernet or a Serial Bus.

5. A method of testing multiple RF modules, adapted for a system of testing multiple RF modules, the system comprising a RF analyzer, a RF switch, a controller module, and a plurality of testing modules, the method comprising:
  causing the testing modules to configure the RF modules to operate in an operation mode by the controller module;
  determining whether to conduct a test for transmitting a RF signal or a test for receiving the RF signal for the RF modules by the controller module;
  causing the RF analyzer to transmit a first RF signal to the RF switch, and causing the RF switch to transmit the first RF signal to the RF modules when conducting the test for receiving the RF signal, before causing the testing modules to receive first testing results generated by the RF modules according to the received first RF signal, by the controller module, wherein each of the RF modules is electrically coupled between the RF switch and each of the testing modules respectively; wherein the first testing results include a power or an intensity of the RF signals, a power efficiency and a sensitivity of the RF modules; and
  causing the testing modules to control the RF modules to transmit a second RF signal to the RF switch, before controlling the RF switch to receive the second RF signal from the RF modules, and causing the second RF signal received by the RF switch to be transmitted to the RF analyzer and the RF analyzer to transmit second testing results according to the received second RF signal to the controller module, by the controller module.

6. The method of testing multiple RF modules according to claim 5, wherein when the RF modules operate in the operation mode the RF modules are configured to receive the RF signals, transmit the RF signals, or select an operational band.

7. The method of testing multiple RF modules according to claim 5, wherein causing the testing modules to configure the RF modules to operate in the operation mode further comprises causing the RF modules to receive the first RF signal, transmit the second RF signal, or select an operational band of the RF modules.

8. The method of testing multiple RF modules according to claim 5, wherein the controller module and the testing modules are connected through an Ethernet or a Serial Bus.

* * * * *